United States Patent
Olnick et al.

(10) Patent No.: US 11,481,581 B2
(45) Date of Patent: Oct. 25, 2022

(54) PROACTIVE POWER OUTAGE IMPACT ADJUSTMENTS VIA MACHINE LEARNING

(71) Applicant: Florida Power & Light Company, Juno Beach, FL (US)

(72) Inventors: Bryan J. Olnick, Weston, FL (US); David L. Herlong, II, West Palm Beach, FL (US); Lakshmi R. Penmetsa, Wellington, FL (US); Kirk C. Suscella, Jr., Jupiter, FL (US); Peter Maciej Kowalow, Palm Beach Gardens, FL (US)

(73) Assignee: Florida Power & Light Company, Juno Beach, FL (US)

( * ) Notice: Subject to any disclaimer, the term of this patent is extended or adjusted under 35 U.S.C. 154(b) by 1099 days.

(21) Appl. No.: 16/110,260

(22) Filed: Aug. 23, 2018

(65) Prior Publication Data
US 2020/0065628 A1 Feb. 27, 2020

(51) Int. Cl.
*G06K 9/62* (2022.01)
*G01R 19/25* (2006.01)
(Continued)

(52) U.S. Cl.
CPC ....... *G06K 9/6262* (2013.01); *G01R 19/2513* (2013.01); *G01R 21/133* (2013.01);
(Continued)

(58) Field of Classification Search
CPC ....... G06F 9/542; G06F 15/18; G01R 21/133; G01R 19/2513; G06K 9/00536;
(Continued)

(56) References Cited

U.S. PATENT DOCUMENTS 5,568,399 A 10/1996 Sumic
6,671,654 B1 12/2003 Forth et al.
(Continued)

FOREIGN PATENT DOCUMENTS

CN 106651198 5/2017
CN 106682080 5/2017
(Continued)

OTHER PUBLICATIONS

Ren, Hui et al., Using Transmission Line Outage Data to Estimate Cascading Failure Propagation in an Electric Power System, Article in Circuits and Systems II: IEEE Transactions on Circuits and Systems-II: Express Briefs, vol. 55, No. 9, Sep. 2008.
(Continued)

*Primary Examiner* — John H Le
(74) *Attorney, Agent, or Firm* — Fleit Intellectual Property Law; Jeffrey N. Giunta

(57) ABSTRACT

A system and method for adjusting estimated number of customers affected by an electrical power distribution network incident. Incident reports indicating a number of affected customers and an incident definition for incidents occurring over an accumulation time are accumulated, where each incident report. For each incident report, a signature is determined based on characterizing respective incidents and includes respective characteristics of the incidents associated with each incident report. A subject incident report is received subsequent to the accumulation time. A signature is determined for the subject incident report. Similar incident reports that have signatures similar to the subject incident are identified. A composite estimated number of affected customers for the subject incident is determined based on the associated numbers of affected customers for each similar incident report. An initial estimate of
(Continued)

customers affected by the subject incident is adjusted based on the composite estimated number of affected customers.

25 Claims, 7 Drawing Sheets

(51) Int. Cl.
| | | |
|---|---|---|
| G06F 9/54 | (2006.01) | |
| G01R 21/133 | (2006.01) | |
| G06N 20/00 | (2019.01) | |
| G06Q 50/06 | (2012.01) | |

(52) U.S. Cl.
CPC .............. *G06F 9/542* (2013.01); *G06N 20/00* (2019.01); *G06Q 50/06* (2013.01)

(58) Field of Classification Search
CPC ........ G06K 9/6262; G06N 20/00; G06N 3/08; G06Q 50/06
USPC .......................................................... 706/12
See application file for complete search history.

(56) References Cited

U.S. PATENT DOCUMENTS

| | | | |
|---|---|---|---|
| 7,010,437 B2 | 3/2006 | Lubkeman et al. | |
| 7,051,244 B2* | 5/2006 | Fisher ................ | H04L 43/0817 714/48 |
| 7,826,990 B2 | 11/2010 | Nasle et al. | |
| 8,020,052 B2 | 9/2011 | Huang et al. | |
| 8,280,656 B2 | 10/2012 | Kreiss et al. | |
| 8,359,248 B2 | 1/2013 | Witter et al. | |
| 8,615,330 B2 | 12/2013 | Dong et al. | |
| 8,751,421 B2* | 6/2014 | Anderson .............. | G06N 20/00 706/12 |
| 8,903,674 B2 | 12/2014 | Hancock et al. | |
| 9,048,664 B2 | 6/2015 | Arya et al. | |
| 9,230,289 B2 | 1/2016 | Omitaomu et al. | |
| 9,297,723 B1 | 3/2016 | Hofmann et al. | |
| 9,947,202 B1 | 4/2018 | Moon et al. | |
| 2010/0275054 A1* | 10/2010 | Grace .................... | G06Q 10/10 714/2 |
| 2012/0316696 A1 | 12/2012 | Boardman et al. | |
| 2013/0232094 A1* | 9/2013 | Anderson .......... | G05B 23/0281 706/12 |
| 2014/0257913 A1 | 9/2014 | Ball et al. | |
| 2014/0278162 A1 | 9/2014 | Riley, Jr. et al. | |
| 2016/0327600 A1 | 11/2016 | Pamulaparthy et al. | |
| 2017/0301044 A1 | 10/2017 | Duncan-Wilson et al. | |
| 2018/0024903 A1 | 1/2018 | Gottlib | |
| 2019/0278646 A1* | 9/2019 | Fernandez ............ | G06F 11/079 |

FOREIGN PATENT DOCUMENTS

| | | |
|---|---|---|
| CN | 107748314 | 3/2018 |
| WO | 2009154632 | 12/2009 |
| WO | 2016151960 | 9/2016 |
| WO | 2018013148 | 1/2018 |

OTHER PUBLICATIONS

M. J. Mousavi and K. L. Butler-Purry, "Temporal Analysis of Power System Measurements for Condition Assessment Purposes," 2007 IEEE Power Engineering Society General Meeting, Tampa, FL, 2007, pp. 1-8.

Nateghi, R. , Guikema, S. and Quiring, S. M. (2014), Power Outage Estimation for Tropical Cyclones: Improved Accuracy with Simpler Models. Risk Analysis, 34.6, pp. 069-1078.

G. B. Giannakis, V Kekatos, N. Gatsis, S. Kim, H. Zhu and B. F. Wollenberg, "Monitoring and Optimization for Power Grids: A Signal Processing Perspective," in IEEE Signal Processing Magazine, vol. 30, No. 5, pp. 107-128, Sep. 2013.

M. Angalakudati et al., "Improving emergency storm planning using machine learning," 2014 IEEE PES T&D Conference and Exposition, Chicago, IL, 2014, pp. 1-6.

C. Rudin et al., "Machine Learning for the New York City Power Grid," in IEEE Transactions on Pattern Analysis and Machine Intelligence, vol. 34, No. 2, pp. 328-345, Feb. 2012.

\* cited by examiner

| 402 | 404 | 406 | 408 | 410 | 412 | 414 | 416 |
|---|---|---|---|---|---|---|---|
| REPORT ID | TIMESTAMP | COMPONENT CAUSING INCIDENT | INCIDENT DESCRIPTION | ACTUAL # CUSTOMERS AFFECTED | RELATED REPORTS | SIGNATURE INFORMATION | PREDICTED # OF CUSTOMERS AFFECTED |
| 1 | 30 JAN 15 04:15 | POLE #15 DOWN | XX | 315 | 8 | XX | 530 |
| 2 | 04 JUN 14 16:38 | TRANSFORMER #83 FAIL | XX | 293 | 16 19 | XX | 303 |
| 3 | 15 FEB 14 12:03 | LINE DOWN 32 LAKE DRIVE | XX | 87 | 38 42 96 | XX | 50 |
| 4 | 08 DEC 13 23:18 | PROTECTION DEVICE 841 OPENED | XX | 183 | 193 832 | XX | 180 |
| ... | ... | ... | ... | ... | ... | ... | ... |

FIG. 4

PROACTIVE POWER OUTAGE IMPACT ADJUSTMENTS VIA MACHINE LEARNING

FIELD OF THE DISCLOSURE

The present disclosure generally relates to monitoring electrical power distribution and transmission systems, and more particularly to electrical power monitoring system that uses machine learning algorithms to adjusts estimates of a number and location of customers affected by reported power system incidents.

BACKGROUND

Electric power transmission and distribution systems used to provide electrical power to customers distributed over a geographic area include many components that are interconnected by electrical conductors to form an electrical power distribution network. The components within the electrical distribution network in many cases include devices that monitor the operation of the network and report detected incidents or problems to a central monitoring system. In some examples, components within an electrical distribution network include Supervisory Control And Data Acquisition (SCADA) equipment to monitor component operations. In some examples, electric utility customers have smart meters that are able to send status messages back to a central monitoring system to indicate a loss or restoration of electrical power to the customer's facility.

Various incidents that can occur with regards to the electrical distribution network, such as a failure of a component in an electrical distribution network, can cause a number of customers to lose electrical power. Many such incidents require a service team to be dispatched to remedy the incident, such as make necessary repairs to equipment that was damaged. In many electrical distribution networks, a number of incidents may occur within a relatively short time period. When a number of incidents occur that is greater than the number that can be serviced by the available repair crews, the incidents are generally prioritized to determine an order of locations to which repair crews are to be dispatched. In general, prioritization of incidents to which repair crews are dispatched is based on the number of customers that are affected by the particular incident. In general, incidents are prioritized in the order of the number of customers to have lost electrical service due to the incident, and thus the number of customers who will have power restored by repairing the cause of the incident. The incident that causes the largest number of customers to lose electrical service are prioritized for dispatching of repair crews over incidents that have fewer number of affected customers.

It is often a challenge to determine the locations of and the actual number of customers who are affected by a particular incident or reported problem. Although many electric power utilities have installed smart power usage meters (smart meters) that are part of an Advance Metering Infrastructure (AMI), the AMI has not been able to reliably estimate the number of customers who have lost electrical power. In an example, smart meters communicate via a wireless network with a central monitoring station. However, the wireless communication network is very limited in bandwidth and messaging throughput. On occasion, communications from smart meters over a grid powered wireless mesh network fail to be received by the central monitoring station. Therefore, not all smart meters in a commercial power distribution network (especially in a wide area power distribution system serving large numbers of customers) can be monitored by a central monitoring station in real time to obtain a complete and contemporaneous system status. The central monitoring station operates with a level of uncertainty regarding which specific customer locations are currently experiencing power outage conditions and which specific customer locations have not lost power or have their power restored following a power outage.

Inaccuracies in the number of customers affected by an incident in an electrical power distribution network can result from the inability to accurately determine which customers have lost electrical power. Such inaccuracies are able to result in improperly prioritizing the dispatching repair crews to address incidents that impact fewer customers than other incidents that are given lower priority and are thus scheduled to be repaired later. These inaccuracies further challenge an ability to accurately notify customers of outages or other effects of an incident.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which:

FIG. 4 illustrates an example incident report database contents;

DETAILED DESCRIPTION

Figure 1:
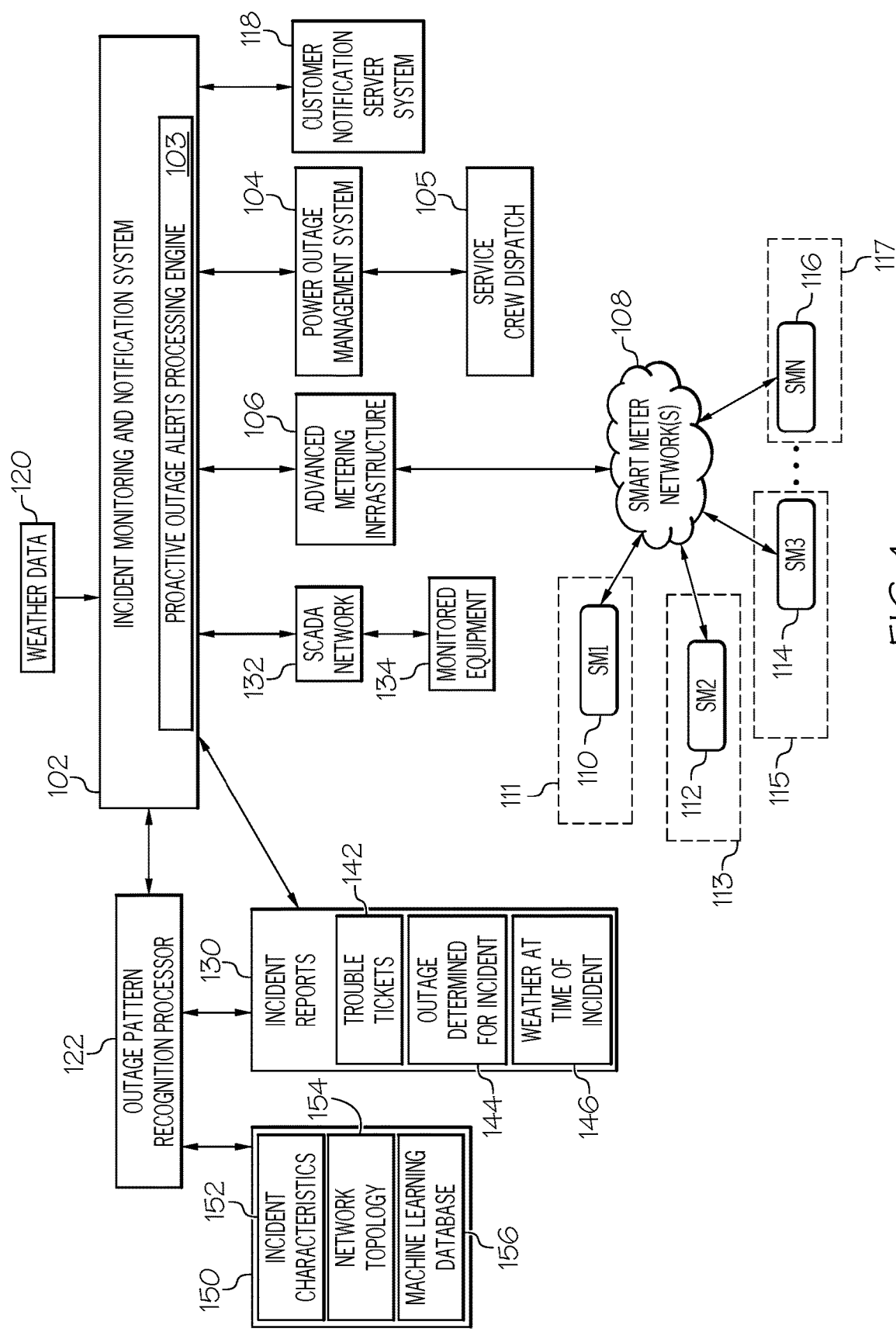
FIG. 1 illustrates an example of an incident monitoring and power outage impact adjustment system.

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one of ordinary skill in the art to variously employ the present subject matter in virtually any appropriately detailed structure and function. Further, the terms and phrases used herein are not intended to be limiting, but rather, to provide an understandable description.

The terms "a" or "an", as used herein, are defined as one or more than one. The term plurality, as used herein, is defined as two or more than two. The term another, as used herein, is defined as at least a second or more. The terms "including" and "having," as used herein, are defined as comprising (i.e., open language). The term "coupled," as used herein, is defined as "connected", although not necessarily directly, and not necessarily mechanically. The term "configured to" describes hardware, software or a combination of hardware and software that is adapted to, set up, arranged, built, composed, constructed, designed or that has any combination of these characteristics to carry out a given function. The term "adapted to" describes hardware, software or a combination of hardware and software that is capable of, able to accommodate, to make, or that is suitable to carry out a given function. Upper or lower case use of terms throughout the specification and claims have the same meaning, for example, "smart meter" and "smart meter" have the same meaning, and "Ticket" and "ticket" have the same meaning.

New Incident Monitoring and Outage Impact Adjustment System and Method

According to an example of an incident monitoring and power outage impact adjustment system, a central power outage monitoring system receives and analyzes incident reports that identify incidents that are detected by monitoring equipment operating in conjunction with an electrical distribution or transmission system. Based on these received incident reports and a definition of device interconnections within the electrical network topology, an initial estimate of customers that are affected by the reported incident is able to be determined. In an example, incident reports, other system monitoring data, or both, are accumulated over a period of time and processed by machine learning processing to create and maintain machine learning algorithms and models to determine an inference of the locations and number of customers affected by incidents indicated in newly processed incident reports. This inference is used in an example to adjust the initial estimate that was determined for this newly received incident report.

In an example, messages are received from one or more smart power usage meters (also referred to as smart meters) that are located at respective customer locations (also referred to as customer premises) at the edge of the electrical power distribution grid or network (also referred to as the Power Network) to determine power conditions in the Power Network, including determining power conditions at customer locations other than the respective customer locations. That is, the central power outage monitoring system selectively receives and analyzes certain wireless messages from one or a few smart meters at customer locations sharing a commonly connected power line section in the Power Network.

A power line section is intended to mean any of: 1) a power line conductor that can distribute electrical power between two switches that each can be opened or closed; 2) a power line conductor between a switch that can be opened or closed and an end of a power line (e.g., an edge of an electrical power distribution network); or 3) a power line conductor between a switch that can be opened or closed and a source of power into a power line (e.g., a power substation, a power generator, or other electrical power source into a power distribution network). Each line section can be considered independent from another line section in the power distribution network. A switch can be used to interconnect a power line section to another power line section to change the paths (topology) of distribution of electrical power in a power distribution network. A transformer is normally not a switched device with a switch that can be opened or closed. A transformer typically transfers power passively without a controllable switch that can be opened or closed.

With information selectively received from the few smart meters, the central monitoring system can reliably determine power ON or OFF conditions at line sections that include at least one smart meter. Power conditions (e.g., ON/OFF) can be determined at more customer locations than the customer locations from which were received the smart meter wireless messages, as will be discussed in more detail below.

According to the example system, smart meters wirelessly selectively send (transmit) outage signals which, according to various embodiments, may also be referred to as meter status messages to the central monitoring station (the Monitor) to report power line outage conditions status (e.g., power OFF, power ON, or power restored from OFF to ON) at the edge of the Power Network via an Advanced Metering Infrastructure (AMI).

The meter status messages are selectively received by the Monitor from each of the smart meters over a wireless communication network (also referred to as a smart meter network or a Communication Network). The meter status messages are transmitted by at least one of the smart meters when a change of status of power line outage conditions is detected by the smart meter. The Communication Network has limited bandwidth and messaging throughput.

The Monitor receives these messages and tracks them in an outage notice database along with Power Network fail/repair/restore status repair ticket records (also referred to as Tickets) for customers in the Power Network. The Tickets indicate the changing status of power line section outage conditions in the Power Network and may be considered to include an outage signal associated with an element of the electrical power distribution network. The Tickets also indicate a repair status for the particular power line section connected to and shared by the particular smart meters on the particular power line section. The Tickets can be created as records in the Tickets database in a number of different ways. For example, a customer may call in a trouble condition experienced at a particular customer premises connected to a particular power line section in the electrical power distribution network. As a second example, service personnel may communicate to a power outage management facility a detected condition at a particular point in a particular power line section in the electrical power distribution network. As a third example, power sensing equipment connected to a particular point in a power line section in the electrical power distribution network may monitor/detect power outage conditions at the particular point. The power sensing equipment may automatically send a power outage status reporting message (also may be referred to as an outage signal or an outage notification signal) to the power outage management facility. A smart meter located at a customer premises is an example of such a power sensing equipment that could automatically send an outage signal.

The Monitor additionally can selectively send an initial signal or ping message over the Communication Network to one of the smart meters which then responds by selectively sending a response signal or a ping response status message that reports the power line outage conditions (e.g., power OFF, power ON, or power restored from OFF to ON) at the smart meter at the time the ping message was selectively received. On occasion no ping response status message is received in response to the ping message selectively sent by the Monitor.

The Monitor uses a smart decision algorithm that combines information from Tickets, received meter status messages, received ping response status messages, and known network topology and equipment in the Power Network (e.g., which set of smart meters are on the same power distribution line section), to make a reliable determination of when power is OFF, ON, and when power has been restored from OFF to ON, at particular smart meters in the same power distribution line section in the Power Network.

This determination for smart meters sharing the same power distribution line section can be reliably made even while not all smart meters have provided to the Monitor their meter status messages or their ping response status messages. The reliable determination by the Monitor can be done while selectively sending only very few ping messages and selectively receiving very few ping response status messages from only a few smart meters on the same power distribution line section. This is important because the Communication Network has very limited bandwidth and messaging throughput. That is, if many messages are sent over the Communication Network between the smart meters and the Monitor it will create a bottleneck in the reporting infrastructure. In bottleneck conditions messages from smart meters will be lost or will not be timely received by the Monitor.

The ability for the Monitor to selectively transmit (send) and selectively receive wireless messages and reliably determine the power line conditions for particular smart meters, provides a means for more accurately and reliably notifying customers regarding the current power conditions at the customers' locations. Aspects of this new and novel power outage notification communication system and related methods will be more fully discussed below.

Example of a Power Outage Monitoring and Alerts Notification System

FIG. 1 illustrates an example of an incident monitoring and power outage impact adjustment system 100. The incident monitoring and power outage impact adjustment system 100 is an example of an affected customer estimate adjustment system that operates to train machine learning systems to develop and maintain machine learning algorithms and models used to identify observable patterns that accompany incidents with power distribution or transmission systems. In an example, affected customer estimate adjustment system adjusts estimates of customers affected by an incident or outage based upon those machine learning algorithm and models as is discussed in further detail below.

In an example, the incident monitoring and power outage impact adjustment system 100 includes components that receive reports of incidents that occur in an electrical power distribution network, assesses the extent and locations of affected customers for those incidents, manages the dispatch of service crews to repair the causes of the incident reports, and notifies customers of power outages. In an example, the incident monitoring and power outage impact adjustment system 100 incorporates machine learning algorithms and models to provide inferences of the effect of newly processed incident reports. These machine learning algorithms and models in an example are trained by processing data pertaining to the observed effects of previously reported incidents. In an example, the inferences of the effects of newly processed incident reports are used to adjust initial estimates of the effect of the reported incidents to produce an adjusted estimate of customers affected by the incident that is the subject of the newly processed incident report. In an example, the initial estimate of an effect of a reported incident is an estimate of the location and number of customers who are impacted by the reported incident, and the inference of the number and locations of customers impacted by the incident, as produced by machine learning algorithms and models, is used to adjust those estimates by incorporating observations of the effects caused by similar past incidents.

The incident monitoring and power outage impact adjustment system 100 includes an incident monitoring and notification system 102 that receives incident reports and associated data, performs an initial estimate of the number and/or locations of customers affected by the incident, and employs machine learning algorithms to improve these estimates to adjust the estimates of customers affected by new incidents. The outage alerts notification incident monitoring and notification system 102 includes a proactive outage alerts processing engine 103 that operates to estimate which customers have been affected by an incident and provides notifications to those customers.

The incident monitoring and notification system 102 is communicatively coupled with a power outage management system 104 that supports maintenance operations to address the reported incidents. The power outage management system 104 provides information regarding reported incidents to a service crew dispatch component 105 that coordinates service crew operations in addressing reported incidents.

The outage alerts notification incident monitoring and notification system 102 is communicatively coupled with a Supervisory Control and Data Acquisition (SCADA) network 132 that provides a communications network to exchange data, commands, and other information with monitored equipment 134. In various examples, various components of an electrical distribution or transmission system are equipped with facilities to support automated monitoring of operational parameters of the components, provide control of the operation of the equipment, perform other functions, or combinations of these. The outage alerts notification incident monitoring and notification system 102 in an example receives data from the SCADA network 132 regarding operational characteristics of or performance issues with the monitored equipment 134. Such information in an example is accumulated over time and used to support outage pattern recognition processing as is described below.

The outage alerts notification incident monitoring and notification system 102 is communicatively coupled with an advanced metering infrastructure 106 that operates to monitor the operational status of an electrical power distribution network. The advanced metering infrastructure 106 is communicatively coupled with one or more smart meter networks 108. The smart meter networks 108 include one or more smart meters 110, 112, 114, 116, located at respective customer premises 111, 113, 115, 117. In an example, the smart meter networks 108 are able to include mesh communications networks.

Figure 3:
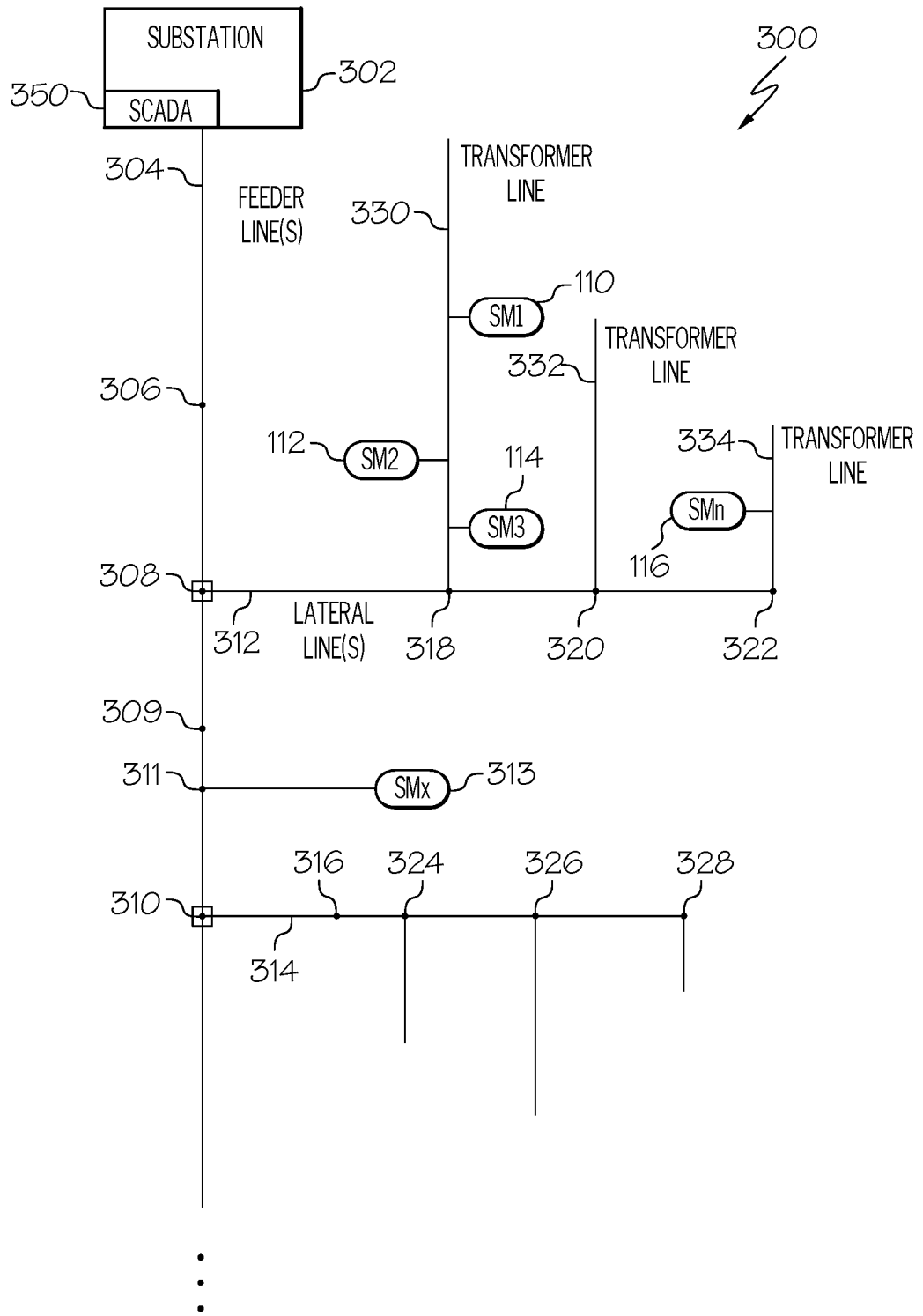
FIG. 3 illustrates an example power distribution system, according to an example.

FIG. 3 illustrates an electrical power distribution network 300, according to an example. The illustrated electrical power distribution network 300 is an example of an electrical power distribution network that is monitored by the incident monitoring and power outage impact adjustment system 100. The illustrated electrical power distribution network 300 incorporates smart meters and other monitoring equipment that report status data back to the incident monitoring and notification system 102. The illustrated electrical power distribution network 300 depicts several representative elements of an electrical power distribution network including substations, feeder lines, lateral lines, transformers, switching equipment and smart meters. In general, electrical power distribution networks are more extensive and include multiple instances of the elements depicted in the illustrated electrical power distribution network 300.

A substation 302 provides electrical power to a wide area such as a neighborhood of customer premises (customer locations). The substation 302 in an example includes a Supervisory Control And Data Acquisition (SCADA) system 350. In general, the SCADA system 350 monitors various operating parameters, such as line voltages and the open/closed status of various circuit protection devices, and reports those parameters to a central controller. In some examples, information reported by the SCADA system 350 is reported to the incident monitoring and notification system 102.

The substation 302 distributes electrical power to one or more feeder lines 304, which in some examples are the main power lines distributing the electricity into the neighborhood. A feeder line 304 can have switching equipment 306 connected to the feeder line 304 such that one of the feeder lines 304 can be manually or automatically connected with another one of the feeder lines 304 as may be necessary or desirable from time to time to reroute power distribution from the substation 302 into the portion of the neighborhood served by the feeder lines 304.

The one or more feeder lines 304, in this example, connect to controllable switching equipment 306, 309, that distributes electrical power to one or more lateral lines 312, 314, and directly from the feeder line 304 to one transformer 311 that distributes power to a smart meter 313, as shown. Lateral lines 312, 314, further distribute the electrical power to transformers 318, 320, 322, 324, 326, 328. The one or more lateral lines 312, 314, can include switching equipment 316. The switching equipment 306, 309, 316 can be manually or automatically operated to connect one of the lateral lines 312, 314 with another power line as may be necessary or desirable from time to time to reroute power distribution from the substation 302 into the portion of the neighborhood served by the one or more lateral lines 312, 314.

Junctions 308 and 310 provide connections to transfer power from the main feeder line 304 to the lateral lines 312, 314. In some examples, junctions 308 and 310 include protection devices and/or monitoring equipment that are able to report status regarding, for example, a loss of electrical power due to opening of the protection device, a restoration of electrical power due to closing of the protection device, losses of electrical power due to an undervoltage condition, other status conditions, or combinations of these. These status conditions in an example are reported to the incident monitoring and notification system 102 discussed above. In the example shown in FIG. 3, a feeder line section can be defined between first switching equipment 306 and second switching equipment 309. This line section comprises the entire lateral line 312, including transformers 318, 320, and 322, transformer lines 330, 332, 334, and smart meters 110, 112, 114, 116.

The transformers 318, 320, 322, are connected to respective transformer lines 330, 332, 334. The other transformers 324, 326, 328 are also connected to respective transformer lines. A transformer line distributes power to one or more customer locations. These customer locations are considered the edge of the power distribution network 300. That is, the power is being distributed to these destinations (customer locations) at the edge of the network 300.

Several smart meters 110, 112, 114, 116, 313, each located at a particular customer location, transfer the electrical power from the connected transformer lines to the particular customer locations. While not every customer location is powered through a smart meter, a large growing percentage of customer locations use smart meters to deliver power to the customer locations. Unless understood clearly different by the context used, use of the term smart meter in this application is intended to also mean the associated customer location where the smart meter is operating to serve power to the customer location.

Additionally, it should be noted that smart meters can measure the level of power line signal at the smart meter. A smart meter can indicate that the power line at the smart meter is ON, when the power line signal is measured as being within a defined operational range for power line signals. For example, and not for limitation, a power line can have a normal operational range of 110 Volts to 120 Volts. A smart meter would indicate that the power line is ON if the measured signal at the smart meter is within this normal operational range.

On the other hand, a smart meter can indicate that a power line is OFF in various ways. One way is for a smart meter to send a Last Gasp (LG) message, just before all power is lost at the power line connected to the particular smart meter. This LG message is an indication that power has been lost at the power line section connected to the smart meter. A smart meter can be considered to indicate a power line OFF condition if the smart meter does not respond (within a determined time period, such as within several seconds) with a ping response message in response to a ping message. If a smart meter is powered by a backup power source (such as using a backup battery) the smart meter could send a ping response message that indicates the power line at the smart meter is OFF. In another example, a smart meter may measure that a level of power at the power line connected to the smart meter is below a normal operational range of 110 Volts to 120 Volts. A smart meter would indicate that the power line is OFF if the measured power signal at the smart meter is below this normal operational range. It is noted that the smart meter could operate from the power line even if the power level is below the normal power signal operational range of 110 Volts to 120 Volts.

In general, smart meters are able to monitor the power line for various conditions, such as line power transitioning to OFF or ON, are report those incidents via the smart meter networks 108 through the advanced metering infrastructure 106 on to the incident monitoring and notification system 102. Due to various limitations, such as bandwidth limitations of the smart meter networks 108, reporting from all smart meters incurring loss or restoration of power may not be reported in a timely manner and may be delayed by an appreciable amount of time.

Incidents associated with different components within the electrical power distribution network 300 are able to be determined to be related to one another based on distances separating the incidents. Such distances between incidents are able to be distances along various paths between locations of components associated with the incidents. In some examples, a distance between incidents is able to be a straight-line physical geographic path between the geographic locations of components associated with the incidents. In other examples, a distance between two incidents is defined as a distance along one or more electrical conductor lines of an electrical distribution system that are connecting components reporting the incidents, which is sometimes referred to as a "schematic distance."

Schematic distances between two electrical distribution components in some examples are able to be further evaluated based upon the characteristics of the electrical conductor lines. For example, schematic distances between two components that are supplied electrical power from different feeder lines may be determined to be greater than schematic distances between two components that are supplied electrical power from the same feeder line, even though the distance along electrical conductors between those two components is the same or less than distances along electrical conductors between components supplied power from different feeder lines.

In some examples, a schematic distance and a geographic distance between two points can be different. In an example, two components of an electrical distribution grid may have a short schematic distance but a relatively long geographic distance compared to differences between geographic distance and schematic distance that are observed between other points in the electrical distribution system. In another example, two such components are able to have a short geographic distance and a long schematic distance. In some examples, either or both types of distances are able to accurately and efficiently processed to determine, for example, whether incidents involving two such components are associated with one another.

A geographic location associated with an incident is able to be any relevant geographic location that pertains to the incident. For example, in the case of an incident related to a loss of electrical power along a lateral power distribution line, geographic locations associated with that incident may be a location of a device reporting the loss of electrical power on the lateral power distribution line, any location that has the loss of power as determined by any technique, a range of geographic locations that has the loss of power, geographic locations of a loss of power determined by processing performed by devices that monitor and identify power line conditions that indicate a loss of power, other geographic locations pertinent to the loss of power, or combinations of these.

Incidents are also able to be determined to be related based upon a time interval between occurrences of each incident. In some examples, incident that occur within a determined time interval are determined to be related, while incident that are separated in time by more than that interval are determined to not be related to one another. Various time intervals are able to be used based on various criteria. In an example, two or more incident that may indicate an occurrence of a high electrical current fault in the electrical distribution system may be determined to be related if they occur within a relatively short time interval, such as five (5) minutes. In other examples, incident may be determined to be related if they occur within relatively long time intervals, such as one day, one week, or longer. In various examples, any time interval is able to be used to determine whether incidents are related or not. In some examples, an operator is able to specify a particular time interval and all incidents that occur within that specified time interval are determined to be related and presented to the operator.

Figure 5:
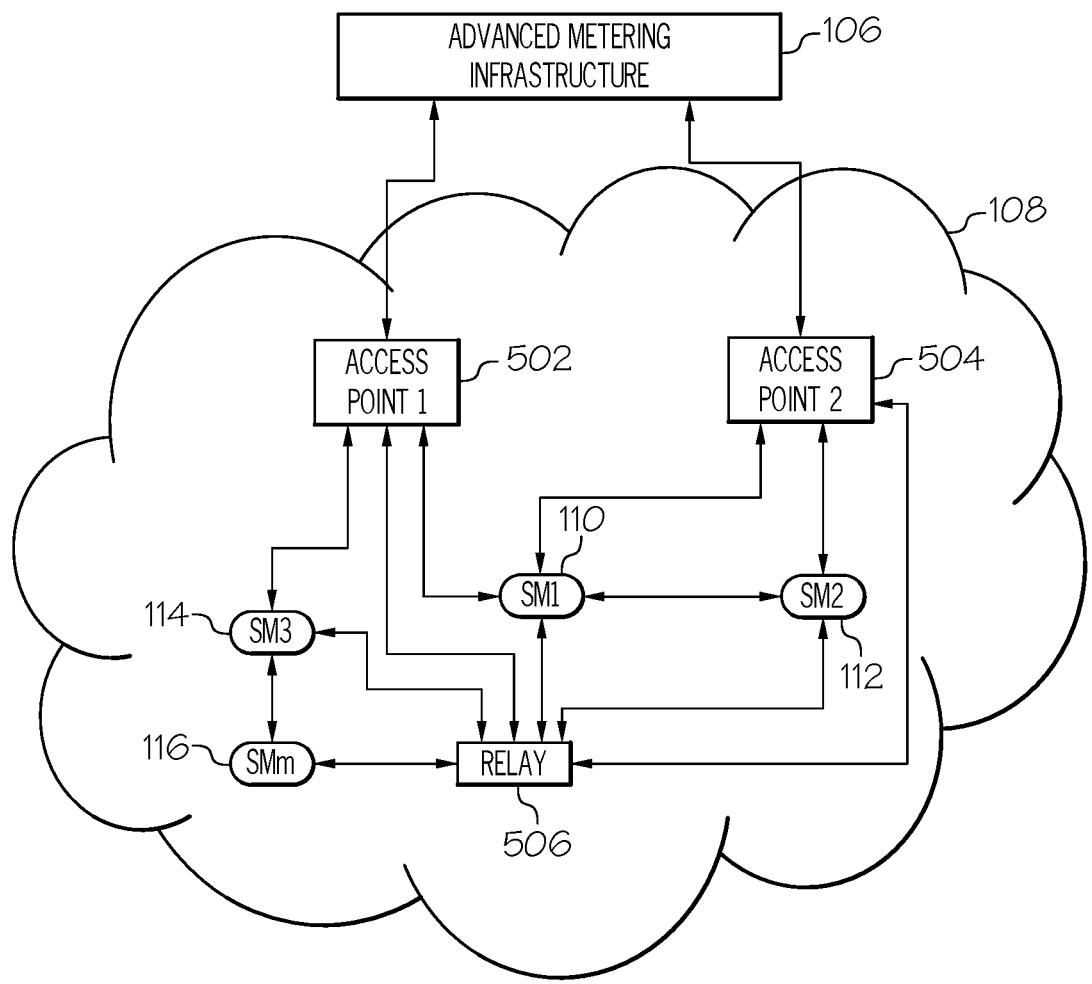
FIG. 5 illustrates a more detailed view of the advanced metering infrastructure and the smart meter networks.

FIG. 5 illustrates a more detailed view of the advanced metering infrastructure 106 and the smart meter networks 108. The advanced metering infrastructure 106, according to the present example, comprises one or more communication servers and one or more communication networks that communicatively couple messages between the smart meter networks 108 and one or more information processing systems used by a power utility service organization. The incident monitoring and notification system 102 is one of those information processing systems. The smart meter networks 108, in the present example, include two access points 502, 504, that are communicatively coupled with a mesh communication network of smart meters 110, 112, 114, 116. Additionally, one or more relay stations 506 can be included in the smart meter network 108 and be communicatively coupled with one or more of the access points 502, 504. The one or more relay stations 506 can assist with relaying messages between the one or more of the access points 502, 504, and one or more of the smart meters 110, 112, 114, 116. It should be noted that each smart meter can operate like a relay station to pass along a received message from one communication device to another communication device. For example, smart meter one 110 can act as a relay station to relay a wireless communication message between smart meter two 112 and access point one 502.

Although each of the smart meters 110, 112, 114, 116 is able report when it detects that electrical power is lost or restored to that smart meter, a central monitor such as the incident monitoring and notifications system 102 often does not receive all such reports. In some instances, some of the communications networks used by the advanced metering infrastructure 106 have very limited bandwidth. On occasion, communications from smart meters over a grid powered smart meter network 108 fail to be received by a central monitoring station, such as the incident monitoring and notifications system 102. Therefore, not all smart meters in a commercial power distribution network (especially in a wide area power distribution system serving large numbers of customers) can be monitored contemporaneously in real time by a central monitoring station.

The uncertainty regarding the how many reports from smart meters reporting power loss or restoration are actually received or lost causes uncertainty in any count of the number of customers that are currently experiencing power outage conditions, as well as uncertainly in which specific customers have or have not lost power or have had their power restored following a power outage. In some examples, the incident monitoring and notifications system 102 operates to improve the identification of customers who are affected by an incident, and also estimate of the number of customers who are affected by that incident, based on analysis of reports received from the advanced metering infrastructure 106 in conjunction with information defining the network topology of the electrical power distribution network. These identifications are further improved in an example based upon inferencing performed by machine learning algorithms and models that are trained based on data indicating observations of past incidents.

Returning to FIG. 1, the outage alerts notification incident monitoring and notification system 102 receives information about weather conditions from a weather data source 120. In various examples, weather conditions at the time of reported incidents are recorded in conjunction with the incident report in order to support more nuanced analysis in characterizing the incident. Such additional information regarding circumstances surrounding an incident is able to support more effective training of machine learning algorithms and models that are used to determine inferences regarding the location and number of customers affected by a reported incident.

The outage alerts notification incident monitoring and notification system 102 is also communicatively coupled with an outage pattern recognition processor 122. The outage pattern recognition processor 122 in an example receives incident reports from the incident monitoring and notification system 102 as well as other information characterizing the effect of reported incidents. In an example the outage pattern recognition processor 122 receives incident reports, resulting trouble tickets, data indicating the actual number of customers that were affected by each incident, other data, or combinations of these. In various examples, information received by the outage pattern recognition processor 122 is able to be received from any one or more suitable source. In an example, the outage pattern recognition processor 122 accesses and processes any data that has been reported from the advanced metering infrastructure 106, other Supervisory Control And Data Acquisition (SCADA) systems, other information, or combinations of these. In the illustrated example, the incident monitoring and notification system 102 sends various types of data to the outage pattern recognition processor 122.

In an example, the outage pattern recognition processor 122 processes and analyzes incident reports and other data characterizing incidents that have occurred over a time duration along with other data pertinent to those incidents in order to characterize each incident for use in training machine learning algorithms and models. The outage pattern recognition processor 122 develops and maintains machine learning algorithms and models that, at least in part in some examples, characterize previously reported incidents, identify previously reported incidents that are similar to a later reported incident, and apply the characterizations of the previously reported incidents to adjusting estimates of the locations and numbers of customers affected by the later reported incident.

In an example, the outage pattern recognition processor 122 is in communications with an incident reports database 130 and a pattern recognition support storage 150. The incident reports database 130 accumulates and stores incident reports and data associated with the incidents that are the subject of those incident reports. The outage pattern recognition processor 122 processes data within the incident reports database 130 and develops machine learning algorithms that are used to adjust estimates of the impact of incidents that are reported after the incidents whose reports are stored in the incident reports database 130.

The incident reports database 130 includes an accumulated trouble tickets storage 142. The accumulated trouble tickets storage 142 in an example stores fail/repair/restore status repair ticket records (also referred to as trouble tickets) for customers in the electrical power distribution network 300 as are contained and reported with in trouble tickets processed by the incident monitoring and notification system 102. In various examples, the stored trouble ticket information includes messages received from the advanced metering infrastructure 106, such as messages from smart meters. The trouble tickets indicate, for example, the changing status of power line section outage conditions in the electrical power distribution network 300 and may be considered to include an outage signal associated with an element of the electrical power distribution network 300. The trouble tickets also indicate a repair status for the particular power line section connected to and shared by the particular smart meters on the particular power line section.

The information stored in the trouble tickets storage 142 can be obtained or created in a number of different ways. For example, a customer may call in a trouble condition experienced at a particular customer premises connected to a particular power line section in the electrical power distribution network 300. As another example, service personnel may communicate to a power outage management facility a detected condition at a particular point in a particular power line section in the electrical power distribution network. As a yet further example, power sensing equipment connected to a particular point in a power line section in the electrical power distribution network may monitor/detect power outage conditions at the particular point. The power sensing equipment may automatically send a power outage status reporting message (also may be referred to as an outage signal or an outage notification signal) to the power outage management system 104. A smart meter located at a customer premises is an example of such a power sensing equipment that could automatically send an outage signal.

Additionally, the trouble tickets storage 142 stores various types of historical information associated with trouble tickets or incident reports. In an example, data is accumulated and stored throughout the lifecycle of a ticket or incident report, such as time information for powerline section power outage events detected and power restore actions taken, notifications sent to customers, messages received from smart meters or other monitoring equipment, and other information used to keep track of power outage and restoration events in the power distribution network 300 and notifications sent to customers.

In the case of an incident that causes a power outage for customers in a geographic area, the limited communications bandwidth of the smart meter networks 108 generally does not support immediate status reporting from all smart meters that have incurred power loss and restoration events. In an example of customers in a relatively large area losing electrical power due to an incident, a central monitoring location, within a time period needed to assess the extent of the effect of that incident, may only receive messages from a relatively small subset of power meters that have lost power due to that incident. Similarly, after power is restored to those customers, the central monitoring location may receive messages from only a relatively small subset of smart meters that the utility power has been restored. In some examples, the incident monitoring and notification system 102 determines an initial estimate of the number of affected customers by statistical processing that is based upon the number of reports received during the time period needed to assess the extent of the effect of that incident and the interconnection topology of the electrical power distribution network.

Although the central monitoring system may only receive status messages from a subset of smart meters within a time duration needed to assess the extent of the effect of that incident, status messages from other smart meters, other monitoring equipment, other sources, or combinations of these, that measure affects caused by the incident will be received over a longer time duration. In some examples, data contained within these messages that are received after the incident has been resolved is used to support training of machine learning algorithms and models that are used to produce inferences with regards to the effects of incidents whose reports are later analyzed.

In the illustrated example, a large number of reports or other messages from smart meters and other reporting equipment operating in association with the electrical power distribution network 300 are accumulated over a time period that is sufficient to receive a significant number of such reports. The incident monitoring and notification system 102 in an example analyzes those reports to determine an associated number of affected customers for trouble tickets that indicates a power outage. This associated number of affected customers is stored for each incident report in the outage determined for incident storage 144. In an example, the associated number of affected customers improves upon the accuracy of the estimate of affected customers that is produced by the proactive outage alerts processing engine 103 based on the subset of reports received within a time duration that extends only a short time past the incident. In various examples, an associated number of affected customers is able to be obtained by any suitable technique, such as by accumulating reports from smart meters or other monitoring equipment for a time duration after a power outage event. In an example, over a fairly long time duration, a statistically large number of power meters that have lost power are able to communicate various reports via the advanced metering infrastructure 106 to the Incident monitoring and notification system 102 where these reports are able to indicate a loss or restoration of electrical power at particular times. In some examples, smart meters are able to be interrogated, e.g., pinged, to cause them to respond with status information. In some examples, communications of such reports may take several hours to several days.

In some examples, other information associated with incidents indicated in received reports is received and stored in the incident reports database 130. For example, weather data is received from weather data sources 120 by the incident monitoring and notification system 102. As reports indicating various types of incidents are received, such as from the advanced metering infrastructure 106, weather conditions received from the weather data sources 120 at the time of the incident are stored in the weather at time of incident storage 146. In various examples, weather conditions are able to include descriptions of type and quantities of precipitation, wind speed and directions, various severe weather conditions, other weather information, or combinations of these. In further examples, weather conditions during time durations prior to the occurrence of an incident are accumulated stored, such as wind speed profiles and directions for hours or days preceding the occurrence of an incident are accumulated and stored to be used as part of later analysis to determine incident characteristics.

The outage pattern recognition processor 122 in an example analyzes data within the incident reports database 130 to perform training of a machine learning model used to, for example, support producing inferences of the number and locations of customers. In an example, such inferences are used to adjust initial power outage impact estimates based on received incident reports. In the illustrated example, the outage pattern recognition processor 122 performs processing to analyze data in the incident reports database 130, including trouble tickets in the trouble ticket storage, associated numbers of affected customers for each of those incident reports that are stored in the outage determined for incident storage 144, weather conditions associated with the incidents that is stored in the weather at time of incident storage 146, any other data, or combinations of these. In some examples, these data items for a number of incident reports and associated instances that are accumulated over time are used to train machine learning algorithms and models maintained by the outage pattern recognition processor 122.

Definitions of and other supporting data for the algorithms and models created by the training performed by the outage pattern recognition processor 122 are stored in a pattern recognition support storage 150. The outage pattern recognition processor 122 in an example analyzes data associated with each incident to determine incident characteristics for each incident. In an example, particular incident characteristics that are applicable for training of machine learning algorithms and models are identified, selected, and refined as part of the machine learning algorithms and models training performed by the outage pattern recognition processor 122 based on the information contained in the accumulated incident reports. These determined incident characteristics are stored in an incident characteristics storage 152 within the pattern recognition support storage 150.

The processing that develops the machine learning algorithms and models implemented by the outage pattern recognition processor 122 are able to incorporate a network topology 154, which defines the electrical interconnections and geographic layout of the electrical power distribution system being monitored and analyzed by the incident monitoring and notification system 102. Incorporating the network topology into the training of the machine learning algorithms and models in some examples supports more accurate inferences to be made by those machine learning algorithms and models.

The outage pattern recognition processor 122 stores data defining the machine learning algorithms and models into a machine learning database 156. The data in the machine learning database 156 in an accessed by the outage pattern recognition processor 122 when performing machine learning based inference operations on data characterizing a subject incident report in order to adjust estimated parameters associated with the incident report, such as the number and location of customers who are affected by the incident.

The incident monitoring and notification system 102 is communicatively coupled with a power outage management system 104. In an example, the notification incident monitoring and notification system 102 determines improved estimates of the number of customers who are affected by an incident and sends those improved estimates to the power outage management system 104. In an example, these improved estimates allow better prioritization of repair activities by making it more likely that earlier repair activities are directed to addressing incidents that affected the largest number of customers.

The outage alerts notification incident monitoring and notification system 102 is communicatively coupled with a customer notification server system 118. The customer notification server system 118 receives and processes requests sent from the incident monitoring and notification system 102. Each request, according to one example, includes: 1) one or more power outage notification messages, 2) identification of at least one customer communication device for destination of the one or more power outage alerts messages in the request, and 3) identification of the communication channel to use for communicating the one or more power outage alerts messages in the request to at least one customer associated with the customer communication device. Therefore, the incident monitoring and notification system 102 sends, via the customer notification server system 118, the one or more power outage alerts notification messages destined for reception by the respective customers. Communications between the customer notification server system 118 and customers is able to be implemented by any suitable technique, and can be supported by any suitable communications device or devices used by the various customers. In an example, the determination of which customers are to receive notifications such as power outage alert messages, is improved based on machine learning algorithms and models developed by the outage pattern recognition processor 122 as is described in further detail below.

Figure 2:
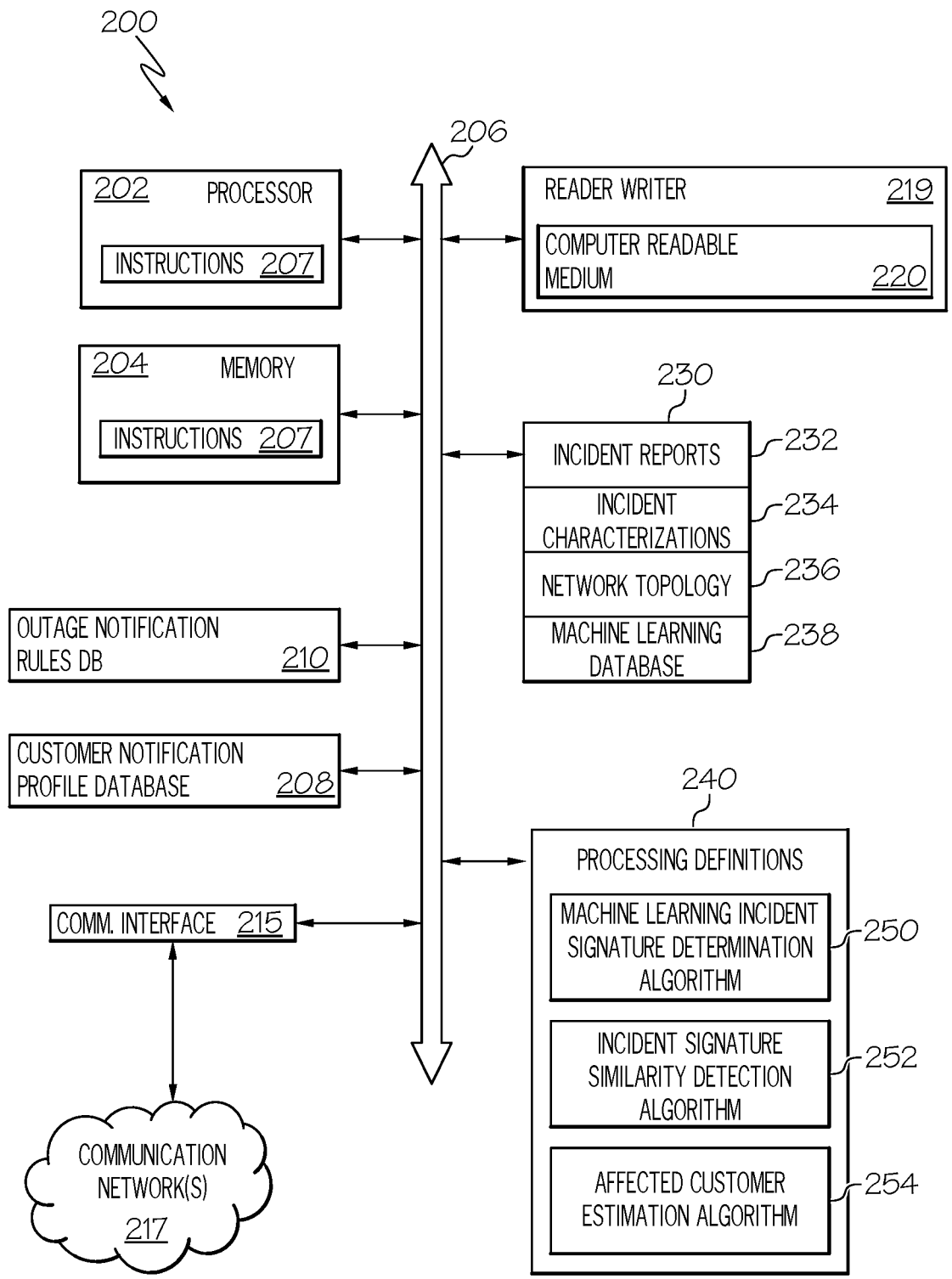
FIG. 2 illustrates an example processing equipment architecture to implement processing described above with regards to the incident monitoring and power outage impact adjustment system shown in FIG. 1.

FIG. 2 illustrates an example processing equipment architecture 200 to implement processing described above with regards to the incident monitoring and power outage impact adjustment system 100. The example processing equipment architecture 200 includes components that are present in and accessed by the incident monitoring and notification system 102 and the outage pattern recognition processor 122. It is clear that the processing described herein is able to be performed by processing equipment organized in any suitable arrangement with equipment that is collocated, equipment dispersed around various systems, equipment dispersed in different physical areas or geographic areas, equipment in any other processing arrangement, or combinations of these.

The example processing equipment architecture 200 includes at least one processor 202 that is communicatively coupled with memory 204, which may include main memory, persistent memory, and storage memory. A bus architecture 206 facilitates communication between various components of the example processing equipment architecture 200. The processor 202 and memory 204 are able to store instructions 207 that are executed by the processor 202 in order to perform at least part of the methods described below.

A communication interface module 215 include one or more communication devices that are communicatively coupled with the processor 202 to facilitate communications between the example processing equipment architecture 200 and one or more remote systems or devices via one or more communication networks 217. Each communication device may be used to communicate with a particular type of communication network 217.

A reader/writer device 219 is communicatively coupled with the processor 202. The reader/writer device 219 can read from or write to a computer readable medium 220. The computer readable medium 220 can store instructions 207, data, and configuration parameters, for use by the processor 202, and by operating system software and applications executing in the incident monitoring and notification system 102. Instructions 207 according to the present example include a proactive outage alerts processing engine 103, an outage notice rules manager 222, and an outage monitor 224, which will be more fully discussed below.

The example processing equipment architecture 200 also includes a data storage 230 that stores data used by the processor 202 to support processing that implements the below described processes and methods. The illustrated data storage 230 includes an incident reports storage 232, an incident characterizations storage 234, a network topology storage 236, and a machine learning database 238. The elements stored in the various storages of the data storage 230 are similar to the analogous elements stored in the incident reports database 130 and the pattern recognition support storage 150 that are described above with regards to the incident monitoring and power outage impact adjustment system 100. In various examples, the data storage 230 is able to store any suitable information that is used to support the operations of the incident monitoring and power outage impact adjustment system 100. In some examples, the data storage 230 stores various elements of historical information that relates to, for example, the lifecycle of each trouble ticket, time information for powerline section power outage events detected and power restore actions taken, notifications sent to customers, messages received from smart meters, and other information used by the incident monitoring and power outage impact adjustment system 100 to keep track of power outage events in the power distribution network 300 and notifications sent to customers.

The example processing equipment architecture 200 also includes a processing definitions storage 240 that stores definitions of algorithm used by the processor 202 to support processing that implements the below described processes and methods. The illustrated processing definitions storage 240 includes an machine learning incident signature determination algorithm 250 that performs training for machine learning algorithms and models. The processing definitions storage 240 also includes an incident signature similarity detection algorithm 252 that determines inferences of effects of incidents whose characteristics are currently being processed. The processing definitions storage 240 also includes an affected customer estimation algorithm 254 that determines an initial estimate of customers affected by an incident.

The example processing equipment architecture 200 also includes a customer notification profile database 208 that stores profile records for each customer that 1) identify the particular customer, 2) indicate a notification channel preference requested by the customer, and 3) identify how each customer wants to be notified based on a selected notification channel preference.

The example processing equipment architecture 200 also includes an outage notification rules database 210. The outage notification rules database 210 stores one or more rules as records in the database. These rules are used by the proactive outage alerts processing engine 103 to determine outage conditions in one or more line sections in the power distribution network 300 and to determine which particular power outage alert message(s) that the incident monitoring and notification system 102 should send to which customer(s) and when to send the particular power outage notification message(s).

FIG. 4 illustrates an example incident report database contents 400. The example incident report database contents 400 depicts an example of data contained in an incident reports database 130 as is discussed above. In some examples, processor 202 accesses data within the example incident report database contents 400 and, based on those accessed values, determines other values that are stored into the example incident report database contents 400. It is to be understood that various examples are able to store different categories of data to support performing the below described methods.

At least part of the contents within the example incident report database contents 400 in an example are maintained by the power outage management system 104 to keep track of repair service tickets (trouble tickets) throughout their lifecycle. The trouble ticket lifecycle information is then further analyzed by machine learning processing performed by the outage pattern recognition processor 122 in order to train machine learning algorithms and models that are used to infer characteristics of other incidents that are reported.

The example incident report database contents 400 depicts a number of incident reports and examples of data stored in association with such reports. The example incident report database contents 400 depicts the stored data in a row and column format for conciseness and clarity of explanation. It is clear that incident reports are able to be stored in any suitable structure or arrangement. The first row 420 of the example incident report database contents 400 is depicted to illustrate the identification of respective characteristics data contained in each respective column. Each row below the first row 420 of the example incident report database contents 400 contains data of a separate incident report.

With regards to the first row 420, a report ID column 402 that indicates that the first column of each incident report includes an identifier of each incident report. A timestamp column 404 indicates that the second column of each incident report includes a timestamp indicating a time of occurrence of the incident being reported. An component causing incident column 406 indicates an event that caused the reported incident and an incident description column 408 contains a description of the incident.

The first row 420 includes an actual number of customers affected column 410 that store an actual number of customers that were affected by the reported incident. In some examples, the actual number of customers affected column 410 includes a count of customers that was obtained based upon reports that were received after a relatively long time after the causing event. As described below, the actual number of customers affected column 410 is able to be populated with data that is obtained after the cause of the reported incident has been repaired or addressed.

The first row 420 includes a related reports column 412. The related reports column in an example includes report identifiers (IDs) of other incident reports that are determined to be related to this incident report. For example, reports from smart meters that received power through a transformer will be listed in an incident report for the opening of a protection relay at the output of that transformer.

The first row 420 includes an incident signature information column 414. The incident signature information column 414 stores event signature information that characterizes each incident report. As described in further detail above, incident signature information is determined in an example based upon machine learning processing to develop algorithms and models. A predicted number of customers affected column 416 describes how many customers were initially estimated to have been affected by the reported incident. The predicted number of customers affected is stored in some examples in order to better train the machine learning algorithms that are used to infer the number and location of customers affected by reported incidents.

The first incident report 422 has a report ID of "1" in the report ID column 402 and occurred at 04:15 on 30 Jan. 2015, as indicated in the timestamp column 404. The component that caused the incident is "Pole #15 Down" as is indicated in the component causing incident column 406.

The information in the incident description column 408 and the signature information are not detailed in this figure in order to simplify the description of this element. In an example, any number of general descriptions of circumstances, repairs, other information, or combinations of these that are received during or at any time after the incident are able to be recorded in the incident description column 408. In an example, information that is determined by machine learning algorithms to be relevant in characterizing incidents to determine similarities and perform machine learning based inferences for new data is able to be stored in the incident signature information column 414.

The first incident report 422 further lists "315" in the actual number of customers affected column 410. The first incident reports also lists "530" in the predicted number of customers affected column 416. This relationship indicates that more customers were predicted to have been affected by the incident than actually were. A machine learning algorithm will develop algorithms and models to infer numbers of affected customers based on this noted difference between initially predicted and actual customers affected given the particular conditions associated with the third incident report. In an example, future incidents with similar conditions will able to be adjusted based on the developed machine learning algorithms.

The example incident report database contents 400 further includes a second incident report 424, a third incident report 426, and a fourth incident report 428. These rows contain information similar to that described above with regards to the first incident report 422. The example incident report database contents 400 further indicates that there are further incident reports stored in this database. Processing, such as is performed by the incident monitoring and notification system 102, continues to add new incident reports to the example incident report database contents 400 as new incident reports are received and processed.

The third incident report 426 lists "87" in the actual number of customers affected column 410. The first incident reports also lists "50" in the predicted number of customers affected column 416. This relationship indicates that for the particular conditions associated with the third incident report, fewer customers were predicted to have been affected by the incident than actually were. A machine learning algorithm will develop algorithms and models to infer numbers of affected customers based on this noted difference between initially predicted and actual customers affected given the particular conditions associated with the third incident report. In an example, future incidents with similar conditions will able to be adjusted based on the developed machine learning algorithms.

Figure 6:
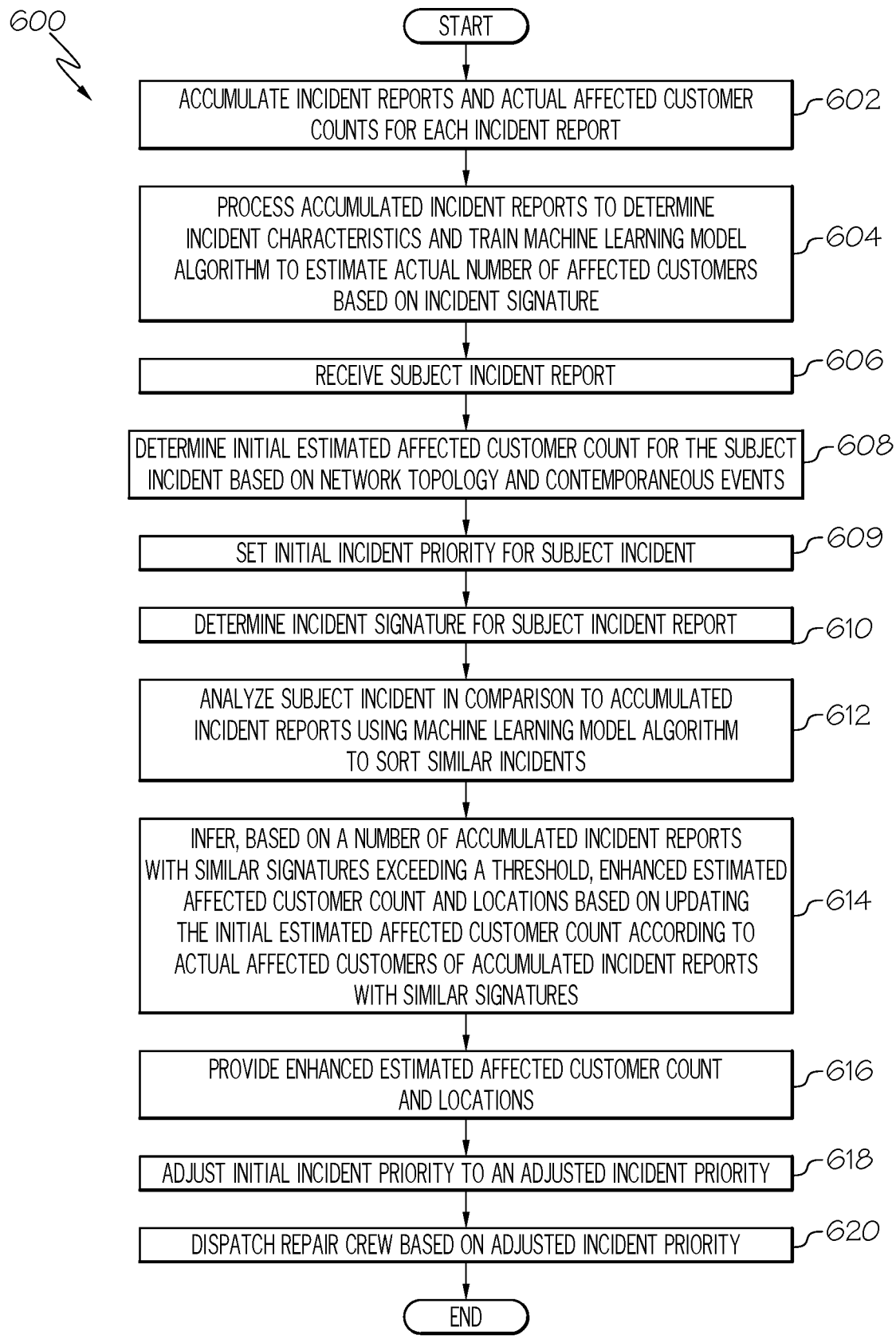
FIG. 6 illustrates a machine learning training and inference process, according to an example.

FIG. 6 illustrates a machine learning training and inference process 600, according to an example. The machine learning training and inference process 600 is an example of a process performed by a combination of the incident monitoring and notification system 102 and the outage pattern recognition processor 122 discussed above. The machine learning training and inference process 600 in an example is able to be performed by a system that has an incident monitor and a training and inference processor.

The machine learning training and inference process 600 accumulates, at 602, incident reports and actual affected customer counts for each incident reports. As discussed above, an incident report in an example is received that describes an incident and includes a description of the equipment affected and where in the network topology the equipment is located. In some examples, the incident monitoring and notification system 102 will respond to a newly received incident report that might indicate a power outage by determining an initial estimate of the number of customers affected by the reported incident. In some examples, this initial estimate is determined based on processing reports received from equipment connected to the electrical distribution network, such as messages of power being lost or restored as reported by the advanced metering infrastructure 106. In some examples, the initial estimate is determined based on automated analysis of the reports received from equipment connected to the electrical distribution network in conjunction with a definition of the interconnections of the electrical distribution network. An example of systems and methods used to determine such an initial estimate is described in U.S. patent application Ser. No. 15/422,095, Filed Feb. 2, 2017 entitle PROACTIVE POWER OUTAGE ALERTS MANAGEMENT SYSTEM AND METHODS and assigned to the assignee of this disclosure. The entire contents and teachings of U.S. patent application Ser. No. 15/422,095 are hereby incorporated herein by reference.

At some time after an incident report for a particular incident is received, a larger number of status reports from equipment connected to the electrical distribution network will be received. The period over which status reports associated with an incident report are received is referred to herein as an accumulation time duration. Such status reports are able to indicate, for example, that electrical power was lost or restored at various devices, such as smart meters communicating to the incident monitoring and notification system 102 via the advanced metering infrastructure 106, from Supervisory Control and Data Acquisition (SCADA) equipment communicating data to the incident monitoring and notification system 102, by other sensors or sources, or combinations of these. In some examples, this additional information is received after a time that is useful to support outage notifications to customers and to conduct and prioritize repair efforts. In an example, the incident monitoring and notification system 102 accumulates this additional information into, for example, the incident reports database 130.

In an example, accumulating incident reports includes accumulating a plurality of incident reports that each describe respective incidents in an electrical power distribution network that occur over an accumulation time duration, where each incident report in the plurality of incident reports indicates a respective associated number of affected customers and an associated respective incident definition associated with a respective component of the electrical power distribution network. In some examples, the plurality of respective characteristics includes a description of a failure causing the incident, a location of the failure within the electrical power distribution network, and at least one additional characteristic associated with the incident. In some examples, the plurality of respective characteristics comprises weather conditions occurring at times proximate to a time of the subject incident. In some examples, the subject incident is caused by a subject component in the electrical power distribution network, and the plurality of respective characteristics of the subject incident report include a location of the subject component within the electrical power distribution network. Further, in some examples, the plurality of respective characteristics includes other incident reports indicating incidents that occur at times proximate to a time of the subject incident. In some of these examples, the subject incident is caused by a subject component in the electrical power distribution network, and the other incident reports include incident reports indicating at least one of: reports from reporting electrical meters of loss of utility power; reports from other devices electrically proximate to the subject component in the electrical power distribution network; and reports from incidents caused by other devices in the electrical power distribution network. In an example, the accumulating is able to be performed by an incident monitor.

The machine learning training and inference process 600 processes, at 604, accumulated incident reports to determine incident characteristic and train machine learning algorithms and models. These machine learning algorithms and models are used in an example to support inferencing operations to identify the customers who are likely affected by a particular incident. In an example, the inferences are used to adjust the initial incident estimate an actual number of customers affected by an incident. Further inferences of the number of customers affected by an incident are able to be used for any suitable purpose, either as estimates to be used themselves or estimates used to support further calculations or inferencing.

Processing the accumulated incident reports in an example includes determining, based on characterizing respective incidents associated with each respective incident report, a respective incident signature for each incident report within the plurality of incident reports, where the respective incident signature includes a plurality of respective characteristics of the respective incident report. In some examples, this processing includes training a machine learning system where the training includes determining, by the machine learning system, the plurality of respective characteristics of the incident reports in the plurality of incident reports; and determining, by the machine learning system, the respective incident signature for incident reports in the plurality of incident reports based on the determined plurality of respective characteristics. In an example, the determining a respective incident signature is able to be performed by a training and inference processor.

In some embodiments, the outage pattern recognition processor 122 is able to utilize machine/computer learning to identify incident signatures and develop machine learning algorithms and models perform inferences with regards to the location and number of customers affected by an incident. In some examples, such machine learning processing operates to identify which elements, such as quantities, values, observations, or other data, are able to serve as distinguishing characteristics of affects that are caused by different incidents, and evaluate these elements in order to determine useful indecent signatures that are able to support inference determinations for other incident reports. In an example, the machine learning algorithms/models are trained using one or more machine learning techniques. For example, in one embodiment, a deep learning artificial neural network (DLANN) model is trained to determine useful characteristics for inclusion into a definition of incident signatures and provide inferences of the number and locations of customers affected by an incident. In further examples, other machine learning models are applicable as well.

A DLANN model is generally comprised of a plurality of connected units referred to as artificial neurons. Each unit is able to transmit a signal to another unit via a connection there between. A unit that receives a signal from another unit processes the signal and may transmit its own signal to another unit based on the processed signal. A unit may be associated with a state (e.g., $0 \leq x \leq 1$) where both a unit and a connection may be associated with a weight that affects the strength of the signal transmitted to another unit. The weight may vary during the learning process of the model. The model may comprise multiple layers of connected units, where different layers perform different transformations on their inputs. The first layer acts as the initial input (e.g., from the inputted data) to the model, where signals from this layer propagate to the final layer (e.g., identified solution). The initial layers of the model may detect specific characteristics of the target solution while inner layers may detect more abstract characteristics based on the output of the initial layers. The final layers may then perform more a complex detection based on the output inner layers to detect the target solution.

The DLANN model utilized by the outage pattern recognition processor 122 in an example is trained by providing training data to the model as an input. The model may be trained at the outage pattern recognition processor 122 and/or at an external information processing system. In one embodiment, the training data comprises historical incident report information, such as has been accumulated in the incident reports database 130. As the DLANN model is trained with historical incident report data, it learns the effects that different types of incidents with various incident signatures have on the electrical distribution system and supports the determination of inferences of which customers are affected by a particular incident for which complete actual information is unavailable regarding the effect of that incident.

The machine learning training and inference process 600 receives, at 606, a subject incident report. In various examples, a subject incident report is able to be a newly received report of an incident that has just occurred, an incident report that has been received at anytime for an incident that occurred in the past and that is now being analyzed, any other suitable incident report being processed, or combinations of these. In an example, the subject incident report is received subsequent to accumulating the incident reports, as described above. The subject incident report in an example indicates that the subject incident occurred at a subject time. In an example, the receiving is able to be performed by an incident monitor.

The machine learning training and inference process 600 determines, at 608, an initial estimated affected customer count for the subject incident based on network topology and contemporaneous events. An example of systems and methods used to determine such an initial estimate is described in aforesaid U.S. patent application Ser. No. 15/422,095, Filed Feb. 2, 2017.

The machine learning training and inference process 600 sets, at 609, an initial incident priority for the received subject incident report. In an example, the initial incident priority for a received incident report, such as the received subject incident report, is set based on the estimated affected customer count for that incident relative to the affected customer counts associated with other reported incidents that have not yet been resolved.

The machine learning training and inference process 600 determines, at 610, an incident signature for the subject incident report. This incident signature in an example includes the characteristics for incidents that were identified by the machine learning model/algorithm development described above.

The machine learning training and inference process 600 analyzes, at 612, the subject incident in comparison to accumulated incident reports using the machine learning algorithms and models to identify similar signatures. In general, machine learning algorithms and models are used to infer values for the subject incident based on similarities to values observed for other incidents that are determined to be similar according to various criteria. In an example, analyzing the subject incident in comparison to accumulated incident reports includes identifying a plurality of similar incident reports in the plurality of incident reports that each has incident signatures similar to the subject incident signature. In an example, identifying a plurality of similar incident reports is able to be performed by a training and inference processor.

The machine learning training and inference process 600 infers, at 614, an enhanced estimated affected customer count and locations. In an example, the enhanced estimated affected customer count and locations are based on updating the initial estimated affected customer count according to actual affected customers that were observed in the accumulated incident reports that have similar signatures. In an example, this inference is determined according to the machine learning algorithms and models that have been trained based on the above described accumulated incident reports and their associated data. In an example, inferring the enhanced estimated customer count and locations includes determining a composite estimated number of affected customers for the subject incident based on the respective associated numbers of affected customers for each respective similar incident report in the plurality of similar incident reports. In an example, determining a composite estimated number of affected customers is able to be performed by a training and inference processor.

In some examples, the initial estimated affected customer count is updated only if it is determined that the number of accumulated incident reports with similar signatures exceeds a minimum threshold number. In various examples, the minimum threshold number of accumulated incident reports with similar signatures is able to be determined by analysis of accumulated incident reports and associated data where that analysis is able to be performed manually, automatically, via machine learning algorithms, or by any combination of these.

The machine learning training and inference process 600 provides, at 616, an enhanced estimated affected customer count and location. In an example, the enhanced estimated affected customer count and location is provided to various components of the incident monitoring and power outage impact adjustment system 100, such as the incident monitoring and notification system 102, the proactive outage alerts processing engine 103, the power outage management system 104, or any combination of these. The enhanced estimated affected customer count in various examples allows more accurate determination of which customers were affected by an incident, as well as a total count of those customers. In an example, providing the enhanced estimated affected customer count includes adjusting the initial estimate of customers affected by the subject incident, as determined above, based on a composite estimated number of affected customers that was determined based on the respective associated numbers of affected customers for each respective similar incident report in the plurality of similar incident reports as described above. In an example, adjusting the initial estimate of customers affected by the subject incident is able to be performed by a training and inference processor.

The machine learning training and inference process 600 adjusts, at 618, the initial incident priority to an adjusted incident priority based on the inferred enhanced estimated affected customer count. In an example, the adjusted incident priority for a received incident report, such as the received subject incident report, is set based on the enhanced estimated affected customer count for that incident relative to affected customer counts associated with other reported incidents that have not yet been resolved.

In an example, the initial incident priority for a received incident report, such as the received subject incident report, is set based on the estimated affected customer count for that incident relative to the estimated affected customer count of other reported incidents that have not yet been resolved.

The machine learning training and inference process 600 dispatches, at 620, a repair crew to address the subject incident based on the adjusted incident priority. In some examples, repair crews are dispatched to address reported incidents based at least in part on the assigned priority of each reported incident. Priorities are generally assigned to incidents based on several factors, one of which is the number of customers affected by the incident. In an example, more efficient and effective power transmission or distribution system operations are able to be achieved by dispatching repair crews according to adjusted incident priorities, where the adjusted incident priorities are determined based at least in part on inferred enhanced estimated customer counts. As described above, the inferred enhanced estimated customer counts are able to be based upon inferred estimates of estimated affected customers that are determined based on machine learning algorithms developed by analysis of previously reported and characterized incidents.

Figure 7:
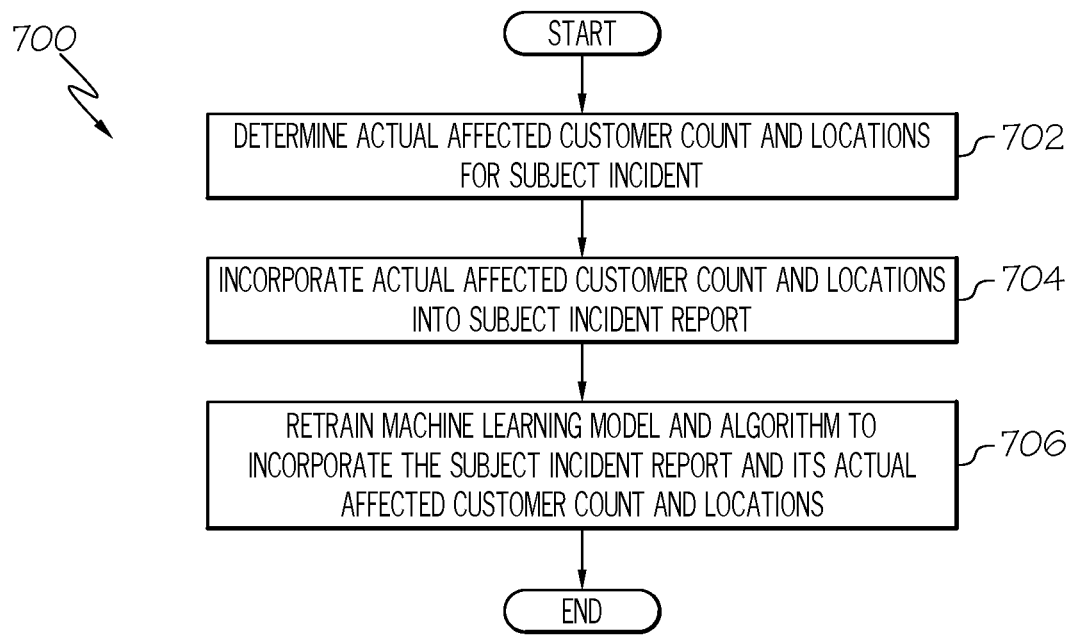
FIG. 7 illustrates an incident data update process, according to an example.

FIG. 7 illustrates an incident data update process 700, according to an example. The incident data update process 700 in an example is performed by the incident monitoring and notification system 102 to update data associated with incidents that have been reported. In the illustrated example, the incident data update process is performed after the machine learning training and inference process 600 in order to accumulate additional information about the subject incident report that was analyzed in that process. This additional information is used, in an example, to further train the machine learning algorithms and models used by the outage pattern recognition processor 122 to provide improved inference operations for additional subject incident reports that are to be processed in the future.

The incident data update process 700 determines, at 702, the actual affected customer count and locations for the subject incident. In an example, the incident monitoring and notification system 102 receives data from equipment monitoring the operations of the electrical distribution network that indicates disruptions or other incidents within the electrical distribution network. For example, the advanced metering infrastructure 106 is able to send data that indicates when power was lost and restored at various locations. Due to the bandwidth limitations of the advanced metering infrastructure 106, more complete data about power losses and restorations may not be received for some time after the power has been lost and restored at all of the locations that were affected by an incident. In an example, the actual affected customer count and locations is based on reports that are collected over a period of time but indicate that incidents, such as power loss and restoration, occurred shortly after the occurrence of a particular incident, such as loss of power as reported by other devices in the power distribution network.

The incident data update process 700 incorporates, at 704, the actual affected customer count and locations into the subject incident report that is associated with the incident that caused the incidents reported for the actual affected customers, such as having lost electrical power.

The incident data update process 700 retrains, at 706, the machine learning algorithms and models to incorporate the subject incident report and its actual affected customer count and locations. The outage pattern recognition processor 122 in an example performs this retraining by incorporating the subject incident report and its actual affected customer count and locations into the training data used as training input into a machine learning algorithms and models training process. Incorporation of the subject incident report and its actual affected customer count and locations into the existing accumulation of incident reports and related data allows for further refinement of the machine learning algorithms and models and supports more accurate inferences of the number and locations of customers that are affected by incidents that are being newly analyzed to evaluate their relative priorities for service actions and in providing notifications of outages or other affects. The incident data update process 700 then ends.

Example Information Processing System

The present subject matter can be realized in hardware or a combination of hardware and software. A system can be realized in a centralized fashion in one computer system or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present subject matter can also be embedded in a computer program product, which comprises all the features enabling the implementation of the methods described herein, and which—when loaded in a computer system—is able to carry out these methods. Computer program in the present context means any expression, in any language, code or notation, of a set of instructions intended to cause a system having an information processing capability to perform a particular function either directly or after either or both of the following a) conversion to another language, code or, notation; and b) reproduction in a different material form.

Each computer system may include, inter alia, one or more computers and at least a computer readable medium allowing a computer to read data, instructions, messages or message packets, and other computer readable information from the computer readable medium. The computer readable medium may include non-transitory computer readable storage medium embodying non-volatile memory, such as read-only memory (ROM), flash memory, disk drive memory, CD-ROM, and other permanent storage. Additionally, a computer medium may include volatile storage such as RAM, buffers, cache memory, and network circuits. Furthermore, the computer readable medium may comprise computer readable information in a transitory state medium such as a network link and/or a network interface, including a wired network or a wireless network, which allow a computer to read such computer readable information.

Non-Limiting Examples

Although specific embodiments of the subject matter have been disclosed, those having ordinary skill in the art will understand that changes can be made to the specific embodiments without departing from the scope of the disclosed subject matter. The scope of the disclosure is not to be restricted, therefore, to the specific embodiments, and it is intended that the appended claims cover any and all such applications, modifications, and embodiments within the scope of the present disclosure.

What is claimed is:

1. A computer implemented method for adjusting an estimated number of customers affected by an incident occurring in an electrical power distribution network, the method comprising:

accumulating, by a processor, a plurality of incident reports describing respective incidents in an electrical power distribution network that occur over an accumulation time duration, each incident report in the plurality of incident reports indicating a respective associated number of affected customers and an associated respective incident definition associated with a respective component of the electrical power distribution network;

determining, by the processor based on characterizing respective incidents associated with each respective incident report, a respective incident signature for each incident report within the plurality of incident reports, the respective incident signature comprising a plurality of respective characteristics of the respective incident report;

receiving, by the processor subsequent to the accumulation time duration, a subject incident report indicating a subject incident that occurred at a subject time;

determining, by the processor, an initial estimate of customers that are affected by the subject incident;

determining, by the processor for the subject incident report, a subject incident signature comprising a plurality of respective characteristics of the subject incident report;

identifying, by the processor, a plurality of similar incident reports in the plurality of incident reports that each has incident signatures similar to the subject incident signature;

determining, by the processor, a composite estimated number of affected customers for the subject incident based on the respective associated numbers of affected customers for each respective similar incident report in the plurality of similar incident reports;

adjusting, by the processor, the initial estimate of customers affected by the subject incident based on the composite estimated number of affected customers to determine an adjusted estimate of customers affected by the subject incident; and prioritizing, by the processor, a dispatching of a service crew based upon the adjusted estimate of customers affected by the subject incident.

2. The method of claim 1, further comprising training a machine learning system, wherein training the machine learning system comprises;

determining, by the processor by the machine learning system, the plurality of respective characteristics of the incident reports within the plurality of incident reports;

determining, by the processor by the machine learning system, the respective incident signature for incident reports in the plurality of incident reports based on the determined plurality of respective characteristics; and identifying, by the processor by the machine learning system, the plurality of similar incident reports based on the receiving the subject incident report and based upon the respective incident signature for incident reports in the plurality of incident reports, and wherein identifying the plurality of similar incident reports comprises instructing the machine learning system to identify incident reports.

3. The method of claim 1, wherein the plurality of respective characteristics comprises a description of a respective failure causing the respective incident associated with each respective incident report, a location of the respective failure within the electrical power distribution network, and at least one additional characteristic associated with the respective incident.

4. The method of claim 1, wherein the plurality of respective characteristics comprises weather conditions occurring at times proximate to a time of the subject incident.

5. The method of claim 1, wherein the subject incident is caused by a subject component in the electrical power distribution network, and wherein the plurality of respective characteristics of the subject incident report comprise a location of the subject component within the electrical power distribution network.

6. The method of claim 1, further comprising:

receiving, by the processor subsequent to the accumulation time duration, a second subject incident report indicating a second subject incident that occurred at a second subject time, where the second subject incident is separate from the subject incident;

determining, by the processor, a second initial estimate of customers affected by the second subject incident, wherein the initial estimate of customers affected by the subject incident is greater than the second initial estimate of customers affected by the second subject incident;

determining, by the processor for the second subject incident report, a second subject incident signature comprising a plurality of respective characteristics of the second subject incident report;

identifying, by the processor, a second plurality of similar incident reports in the plurality of incident reports that each has incident signatures similar to the second subject incident signature;

determining, by the processor, a second composite estimated number of affected customers for the second subject incident based on the respective associated numbers of affected customers for each respective similar incident report in the second plurality of similar incident reports;

adjusting, by the processor, the second initial estimate of customers affected by the second subject incident based on the second composite estimated number of affected customers to determine a second adjusted estimate of customers affected by the second subject incident; and based on the second adjusted estimate of customers affected by the second subject incident being greater than the adjusted estimate of customers affected by the subject incident, dispatching a first service crew to address the subject incident after dispatching a second service crew to address the subject incident.

7. The method of claim 1, wherein the adjusting the initial estimate of customers affected by the subject incident based on the composite estimated number of affected customers is based on a number of similar incident reports in the plurality of similar incident reports exceeding a threshold number.

8. The method of claim 1, wherein the plurality of respective characteristics comprises other incident reports indicating incidents that occur at times proximate to a time of the subject incident.

9. The method of claim 8, wherein the subject incident is caused by a subject component in the electrical power distribution network, and wherein the other incident reports comprise incident reports indicating at least one of:

reports from reporting electrical meters of loss of utility power;

reports from other devices electrically proximate to the subject component in the electrical power distribution network; and reports from incidents caused by other devices in the electrical power distribution network.

10. An affected customer estimate adjustment system, comprising:

a processor;

memory communicatively coupled to the processor;

an incident monitor, communicatively coupled to the processor and the memory, that, when operating:

accumulates, by the processor, a plurality of incident reports describing respective incidents in an electrical power distribution network that occur over an accumulation time duration, each incident report in the plurality of incident reports indicating a respective associated number of affected customers and an associated respective incident definition associated with a respective component of the electrical power distribution network; and receives, by the processor subsequent to the accumulation time duration, a subject incident report indicating a subject incident that occurred at a subject time; and a training and inference processor that, when operating:

determines, based on characterizing respective incidents associated with each respective incident report, a respective incident signature for each incident report within the plurality of incident reports, the respective incident signature comprising a plurality of respective characteristics of the respective incident report;

determines, for the subject incident report, a subject incident signature comprising a plurality of respective characteristics of the subject incident report;

identifies a plurality of similar incident reports in the plurality of incident reports that each has incident signatures similar to the subject incident signature;

determines, by the processor, a composite estimated number of affected customers for the subject incident based on the respective associated numbers of affected customers for each respective similar incident report in the plurality of similar incident reports; and adjusts, by the processor, an initial estimate of customers affected by the subject incident based on the composite estimated number of affected customers to determine an adjusted estimate of customers affected by the subject incident.

11. The affected customer estimate adjustment system of claim 10, further comprising a service crew dispatch system that, when operating, prioritizes, by the processor, a dispatching of a service crew based upon the adjusted estimate of customers affected by the subject incident.

12. The affected customer estimate adjustment system of claim 10, wherein the incident monitor, when operating, further determines the initial estimate of customers that are affected by the subject incident.

13. The affected customer estimate adjustment system of claim 10, further comprising a machine learning system that, when operating, trains itself based on accumulated data to develops and maintains machine learning algorithms and models, the machine learning system developing the machine learning algorithm and models by at least:
determining, by the processor, the plurality of respective characteristics of the incident reports within the plurality of incident reports;
determining, by the processor, the respective incident signature for incident reports in the plurality of incident reports based on the determined plurality of respective characteristics; and
identifying, by the processor, the plurality of similar incident reports based on receipt of the subject incident report and based upon the respective incident signature for incident reports in the plurality of incident reports, and
wherein the incident monitor identifies the plurality of similar incident reports by at least instructing the machine learning system to identify incident reports.

14. The affected customer estimate adjustment system of claim 10, wherein the plurality of respective characteristics comprises a description of a failure causing the respective incident associated with each respective incident report, a location of the failure within the electrical power distribution network, and at least one additional characteristic associated with the respective incident.

15. The affected customer estimate adjustment system of claim 10, wherein the plurality of respective characteristics comprises weather conditions occurring at times proximate to a time of the subject incident.

16. The affected customer estimate adjustment system of claim 10, wherein the subject incident is caused by a subject component in the electrical power distribution network, and wherein the plurality of respective characteristics of the subject incident report comprise a location of the subject component within the electrical power distribution network.

17. The affected customer estimate adjustment system of claim 10, wherein the incident monitor, when operating, further:
receives, by the processor subsequent to the accumulation time duration, a second subject incident report indicating a second subject incident that occurred at a second subject time, where the second subject incident is separate from the subject incident;
determines, by the processor, a second initial estimate of customers affected by the second subject incident, wherein the initial estimate of customers affected by the subject incident is greater than the second initial estimate of customers affected by the second subject incident;
determines, by the processor for the second subject incident report, a second subject incident signature comprising a plurality of respective characteristics of the second subject incident report;
identifies, by the processor, a second plurality of similar incident reports in the plurality of incident reports that each has incident signatures similar to the second subject incident signature;
determines, by the processor, a second composite estimated number of affected customers for the second subject incident based on the respective associated numbers of affected customers for each respective similar incident report in the second plurality of similar incident reports;
adjusts, by the processor, the second initial estimate of customers affected by the second subject incident based on the second composite estimated number of affected customers to determine a second adjusted estimate of customers affected by the second subject incident; and
based on the second adjusted estimate of customers affected by the second subject incident being greater than the adjusted estimate of customers affected by the subject incident, dispatches a first service crew to address the subject incident after dispatching a second service crew to address the subject incident.

18. The affected customer estimate adjustment system of claim 10, wherein the plurality of respective characteristics comprises other incident reports indicating incidents that occur at times proximate to a time of the subject incident.

19. The affected customer estimate adjustment system of claim 18, wherein the subject incident is caused by a subject component in the electrical power distribution network, and wherein the other incident reports comprise incident reports indicating at least one of:
reports from reporting electrical meters of loss of utility power;
reports from other devices electrically proximate to the subject component in the electrical power distribution network; and
reports from incidents caused by other devices in the electrical power distribution network.

20. A non-transitory computer readable storage medium having computer readable program code embodied therewith, the computer readable program code comprising instructions executable by a processor which, responsive to the instructions, performs the following operations:
accumulate, by a processor, a plurality of incident reports describing respective incidents in an electrical power distribution network that occur over an accumulation time duration, each incident report in the plurality of incident reports indicating a respective associated number of affected customers and an associated respective incident definition associated with a respective component of the electrical power distribution network;
determine, by the processor based on characterizing respective incidents associated with each respective incident report, a respective incident signature for each incident report within the plurality of incident reports, the respective incident signature comprising a plurality of respective characteristics of the respective incident report;
receive, by the processor subsequent to the accumulation time duration, a subject incident report indicating a subject incident that occurred at a subject time;

determine, by the processor for the subject incident report, a subject incident signature comprising a plurality of respective characteristics of the subject incident report;

identify, by the processor, a plurality of similar incident reports in the plurality of incident reports that each has incident signatures similar to the subject incident signature;

determine, by the processor, a composite estimated number of affected customers for the subject incident based on the respective associated numbers of affected customers for each respective similar incident report in the plurality of similar incident reports; and adjust, by the processor, an initial estimate of customers affected by the subject incident based on the composite estimated number of affected customers to determine an adjusted estimate of customers affected by the subject incident.

21. The computer readable storage medium of claim 20, where the computer readable program code further comprising instructions executable by a processor which, responsive to the instructions, further performs the following operation: training a machine learning system, wherein training the machine learning system comprises;

determining, by the processor, the plurality of respective characteristics of the incident reports within the plurality of incident reports;

determining, by the processor, the respective incident signature for incident reports in the plurality of incident reports based on the determined plurality of respective characteristics; and identifying, by the processor, the plurality of similar incident reports based on receipt of the subject incident report and based upon the respective incident signature for incident reports in the plurality of incident reports, and wherein identifying the plurality of similar incident reports comprises instructing the machine learning system to identify incident reports.

22. The computer readable storage medium of claim 20, where the computer readable program code further comprising instructions executable by a processor which, responsive to the instructions, further performs the following operation: prioritizing, by the processor, a dispatching of a service crew based upon the adjusted estimate of customers affected by the subject incident.

23. The computer readable storage medium of claim 20, where the computer readable program code further comprising instructions executable by a processor which, responsive to the instructions, further performs the following operation: determining, by the processor, the initial estimate of customers that are affected by the subject incident.

24. The computer readable storage medium of claim 20, wherein the plurality of respective characteristics comprises other incident reports indicating incidents that occur at times proximate to a time of the subject incident.

25. The computer readable storage medium of claim 24, wherein the subject incident is caused by a subject component in the electrical power distribution network, and wherein the other incident reports comprise incident reports indicating at least one of:

reports from reporting electrical meters of loss of utility power;

reports from other devices electrically proximate to the subject component in the electrical power distribution network; and reports from incidents caused by other devices in the electrical power distribution network.

* * * * *